United States Patent
Clark

(10) Patent No.: US 7,755,128 B2
(45) Date of Patent: Jul. 13, 2010

(54) SEMICONDUCTOR DEVICE CONTAINING CRYSTALLOGRAPHICALLY STABILIZED DOPED HAFNIUM ZIRCONIUM BASED MATERIALS

(75) Inventor: Robert D. Clark, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 515 days.

(21) Appl. No.: 11/688,643

(22) Filed: Mar. 20, 2007

(65) Prior Publication Data
US 2008/0230854 A1    Sep. 25, 2008

(51) Int. Cl.
H01L 29/78    (2006.01)

(52) U.S. Cl. ............... 257/310; 257/411; 257/E29.132; 257/E29.162

(58) Field of Classification Search .................. 257/296, 257/310, 410, 411, 412, E29.132, E29.162, 257/E29.255, E29.345
See application file for complete search history.

(56) References Cited

U.S. PATENT DOCUMENTS

| | | | |
|---|---|---|---|
| 6,297,539 B1 * | 10/2001 | Ma et al. ..................... | 257/410 |
| 6,552,388 B2 * | 4/2003 | Wilk et al. ................... | 257/324 |
| 7,091,568 B2 * | 8/2006 | Hegde et al. ................. | 257/410 |
| 2007/0069311 A1 * | 3/2007 | Adetutu et al. .............. | 257/410 |

OTHER PUBLICATIONS

Xinyuan Zhao, et al., "First-Principles Study of Electronic and Dielectric Properties of $ZrO_2$ and $HfO_2$", Mat. Res. Soc. Symp. Proc. vol. 745 © 2003 Materials Research Society, pp. 283-289.

Karaulov, A. G., et al., "Preparation and Use of Articles From Monoclinic Zirconium-Hafnium Solid Solutions of Oxides" (1 page, abstract only) 2005.

R. I. Hegde, et al., "Microstructure Modified $HfO_2$ Using Zr Addition With $TA_xC_y$ Gate for Improved Device Performance and Reliability", IEEE, 2005, (4 pages).

C. Zhao, et al., "Crystallization and Tetragonal-Monoclinic Transformation in $ZrO_2$ and $HfO_2$ Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

(Continued)

*Primary Examiner*—Minh-Loan T Tran
*Assistant Examiner*—W. Wendy Kuo
(74) *Attorney, Agent, or Firm*—Oblon, Spivak, McClelland, Maier & Neustadt, L.L.P.

(57) ABSTRACT

A semiconductor device, such as a transistor or capacitor is provided. The device includes a substrate, a gate dielectric over the substrate, and a conductive gate dielectric film over the gate dielectric. The gate dielectric includes a doped hafnium zirconium oxide containing one or more dopant elements selected from Group II, Group XIII, silicon, and rare earth elements of the Periodic Table. According to one embodiment, the conductive gate dielectric can contain doped hafnium zirconium nitride or doped hafnium zirconium oxynitride.

17 Claims, 8 Drawing Sheets

OTHER PUBLICATIONS

Kyoung-Ryul Yoon, et al., "Performance and Reliability of MIM (Metal-Insulator-Metal Capacitors With $ZrO_2$ for 50nm DRAM Application", Extended Abstracts of the 2005 International Conference on Solid State Devices and Materials, Kobe, 2005, pgs. 188-189.

Hyoungsub Kim, et al., "Comparative Study on Electrical and Microstructural Characteristics of $ZrO_2$ and $HfO_2$ Grown by Atomic Layer Deposition", J. Mater. Res., vol. 20, No. 11, Nov. 2005, © Material Research Society, pp. 3125-3132.

Y. Kuo, et al., "Sub 2 nm Thick Zirconium Doped Hafnium Oxide High-K Gate Dielectrics", Thin Film Nano & Microelectronics Research Laboratory (1 page), 208th Electrochemical Society Meeting MA2005-02, Oct. 16-21, 2005, Los Angeles, California.

Tsunehiro Ino, et al., "Dielectric Constant Behavior of Oriented Tetragonal Zr-Si-O System", Extended Abstracts of the 2006 International Conference on Solid State Devices and Materials, Yokohama 2006, pp. 404-405.

Xinyuan Zhao, et al., "Phonons and Lattice Dielectric Properties of Zirconia", Physical Review B. vol. 65, pp. 075105-1-075105-10, Jan. 2002.

G. M. Rignanese, et al., "First-Principles Investigation of High-K Dielectrics: Comparison Between the Silicates and Oxides of Hafnium and Zirconium", Physical Review B 69, 2004, pp. 184301-1-184301-10.

H. Y. Yu, et al., "Physical and Electrical Characteristics of HfN Gate Electrode for Advanced MOS Devices", IEEE Electron Device Letters, vol. 24, No. 4, Apr. 2003, pp. 230-232.

* cited by examiner

SEMICONDUCTOR DEVICE CONTAINING CRYSTALLOGRAPHICALLY STABILIZED DOPED HAFNIUM ZIRCONIUM BASED MATERIALS

CROSS-REFERENCE TO RELATED APPLICATIONS

This application is related to co-pending U.S. patent application Ser. No. 11/668,675, entitled "METHOD OF FORMING CRYSTALLOGRAPHICALLY STABILIZED DOPED HAFNIUM ZIRCONIUM BASED FILMS," filed on Mar. 20, 2007, the entire content of which is hereby incorporated by reference.

FIELD OF INVENTION

The present invention relates to high dielectric constant (high-k) materials for semiconductor devices, and more particularly to methods of forming crystallographically stabilized doped hafnium zirconium oxide, nitride, or oxynitride films.

BACKGROUND OF THE INVENTION

Conventional complimentary metal oxide semiconductor (CMOS) technology requires gate dielectric layers having higher dielectric constant than $SiO_2$ or SiON. High-k materials such as $HfO_2$ and $ZrO_2$ have been investigated extensively as possible alternatives to $SiO_2$-based options due to their relatively high dielectric constants and large bandgaps. So far, $HfO_2$ has been favored due to its greater stability in contact with Si (e.g., Si substrate or poly-Si electrode), but $ZrO_2$ has been shown to have certain advantages over $HfO_2$, including the possibility of forming the high permittivity and large band gap tetragonal crystallographic form under typical processing conditions used for manufacturing integrated circuits.

In general, $HfO_2$ and $ZrO_2$ have many similar properties and are completely miscible in the solid state. $HfO_2$ and $ZrO_2$ mixtures have been reported to exhibit improved properties over the pure $HfO_2$ and $ZrO_2$ materials, including improved electrical, film growth, and thermal stability characteristics. However, further developments are needed for designing and forming new mixtures of $HfO_2$ and $ZrO_2$ for use as high-k materials in semiconductor devices.

While $HfO_2$ and $ZrO_2$ mixtures have exhibited improved properties, conventional CMOS technology has not successfully utilized $HfO_2$ and $ZrO_2$ mixtures because the combination of Hf and Zr needs to be stabilized. Some crystallographic forms are more desirable than others. However, conventional approaches to the use of mixed Hf and Zr have not resolved how to stabilize a preferred crystallographic form.

SUMMARY OF THE INVENTION

An object of the present invention is to address the above-identified and other limitations of conventional semiconductor devices.

Embodiments of the invention provide a method for forming crystallographically stabilized doped hafnium zirconium based films by atomic layer deposition (ALD) and plasma enhanced ALD (PEALD). The doped hafnium zirconium based films include oxide, nitride, and oxynitride films that further contain one or more dopant elements selected from Group II, Group XIII, silicon, and rare earth elements of the Periodic Table and provide improved materials properties over un-doped hafnium zirconium based films. For example, the doped hafnium zirconium based films may be used in advanced semiconductor applications that include future generations of high-k dielectric materials for use as both capacitor and gate dielectrics and as gate electrode materials.

According to one embodiment of the invention, a method is provided for processing a substrate by disposing the substrate in a process chamber and exposing the substrate to a gas pulse sequence to deposit a doped hafnium zirconium based film with a desired thickness. The gas pulse sequence includes, in any order: a) sequentially first, exposing the substrate to a gas pulse comprising a hafnium precursor, and second, exposing the substrate to a gas pulse comprising an oxygen-containing gas, a nitrogen-containing gas, or an oxygen- and nitrogen-containing gas; b) sequentially first, exposing the substrate to a gas pulse comprising a zirconium precursor, and second, exposing the substrate to a gas pulse comprising the oxygen-containing gas, the nitrogen-containing gas, or the oxygen- and nitrogen-containing gas; and c) sequentially first, exposing the substrate to a gas pulse comprising one or more dopant elements selected from Group II, Group XIII, silicon, and rare earth elements of the Periodic Table, and second, exposing the substrate to a gas pulse comprising the oxygen-containing gas, the nitrogen-containing gas, or the oxygen- and nitrogen-containing gas. The method further includes each of a), b) and c) being optionally repeated any number of desired times, and the gas pulse sequence including a), b) and c) being optionally repeated, in any order, any number of desired times to achieve the desired thickness. According to one embodiment of the invention, the method further includes purging or evacuating the process chamber after at least one of the exposing steps.

According to another embodiment of the invention, the hafnium and zirconium precursors may be pulsed together, and either or both may be pulsed with the one or more dopant elements.

According to yet another embodiment of the invention, a method is provided for processing a substrate by a) disposing the substrate in a process chamber; b) exposing the substrate to a gas pulse comprising hafnium and zirconium precursors and one or more dopant elements selected from Group II, Group XIII, silicon, and rare earth elements of the Periodic Table; and c) exposing the substrate to a gas pulse containing an oxygen-containing gas, a nitrogen-containing gas, or an oxygen- and nitrogen-containing gas. The method further includes b) and c) being optionally repeated a desired number of times to deposit a doped hafnium zirconium based film with a desired thickness. In another embodiment of the present invention, a semiconductor device includes a substrate, a gate dielectric over the substrate, wherein the gate dielectric comprises a doped hafnium zirconium oxide film containing one or more dopant elements selected from Group II, Group XIII, silicon, and rare earth elements of the Periodic Table; and a conductive gate electrode film over the gate dielectric.

In another embodiment of the present invention, a semiconductor device includes: a substrate; a gate dielectric over the substrate, wherein the gate dielectric comprises a doped hafnium zirconium oxide film of the following formula: $Hf_xZr_yD'_kO_m$ wherein D' includes one or more dopant elements selected from Be, Mg, Ca, Sr, Ba, Ra, B, Al, Ga, In, Tl, Si, Y, Lu, La, Ce, Pr, Nd, Sm, Eu, Gd, Tb, Dy, Ho, Er, Tm, and Yb, and wherein x, y, k, and m are non-zero numbers; and a conductive gate electrode film over the gate dielectric.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
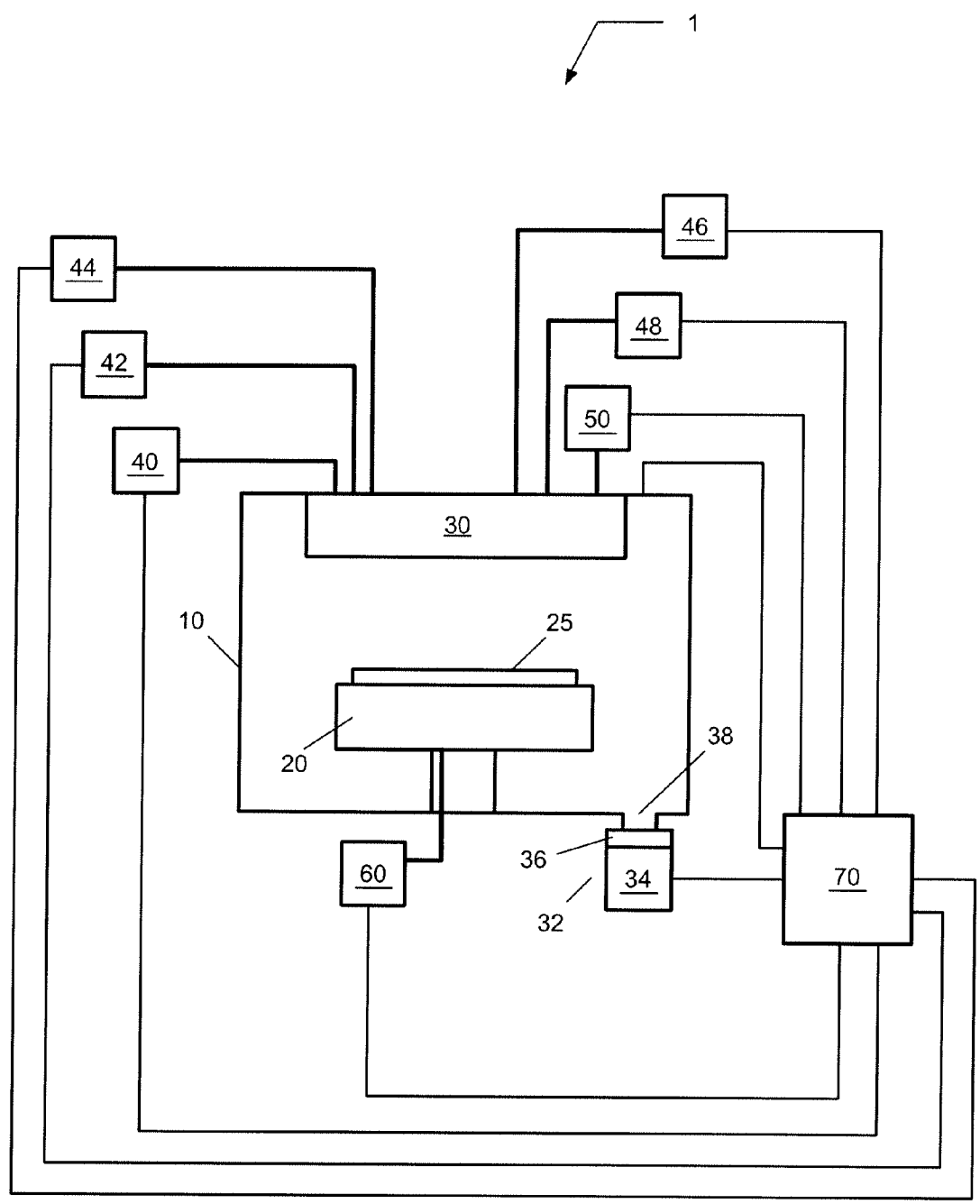
FIG. 1A depicts a schematic view of an ALD system in accordance with an embodiment of the invention.

Doped hafnium zirconium based materials can provide beneficial thermal and electrical characteristics for semiconductor applications. Because hafnium and zirconium are chemically similar and practically infinitely miscible as oxides, nitrides, and oxynitrides, they form highly stable solid solutions. Benefits of films containing doped hafnium zirconium based materials include increased thermal stability in contact with silicon or metal gate electrode material, increased crystallization temperature, increased dielectric constant of the doped hafnium zirconium oxide material compared to hafnium oxide, decreased density of interface traps, decreased threshold voltage shifts and Fermi level pinning, and improved processing characteristics.

$ZrO_2$ and $HfO_2$ can both form monoclinic, tetragonal, and cubic polymorphs (crystallographic forms) but it has been shown that the cubic form is the most stable form at typical semiconductor processing temperatures. Calculations indicate that the tetragonal form has the highest band gap and permittivity, with predicted dielectric constants of about 70 and 38 for $ZrO_2$ and $HfO_2$, respectively. Therefore, the tetragonal form, and even the cubic form, both of which have higher dielectric constants than the monoclinic form, may be desirable in applications where high dielectric constants are needed. It has been shown experimentally, that the tetragonal form of $ZrO_2$ is easier to obtain than $HfO_2$ at typical semiconductor processing temperatures, but annealing at high temperature reduces the tetragonal forms of both $ZrO_2$ and $HfO_2$. In general, $HfO_2$ and $ZrO_2$ have many similar properties and are completely miscible in the solid state. Mixtures of $HfO_2$ and $ZrO_2$ have been reported to exhibit improved properties over the un-doped $HfO_2$ and $ZrO_2$ materials, including improved electrical, film growth, and thermal stability characteristics. In one reported example, maximum thermal stability has been reported for mixture containing 40% $HfO_2$ and 60% $ZrO_2$.

Embodiments of the invention utilize the capability of doping hafnium zirconium oxide films to crystallographically stabilize the high dielectric constant tetragonal or cubic forms of $ZrO_2$ in the hafnium zirconium oxide films, thereby also stabilizing tetragonal or cubic forms of $HfO_2$ in the mixture. The resulting doped hafnium zirconium oxide materials have high dielectric constants and good thermal stability in contact with Si.

By analogy with mixtures of $HfO_2$ and $ZrO_2$ materials, doped hafnium zirconium nitride and doped hafnium zirconium oxynitride materials have advantages such as improved thermal stability over the pure nitride and oxynitride materials. Furthermore, doped hafnium zirconium nitride and doped hafnium zirconium oxynitride materials are logical choices for gate electrode materials on hafnium zirconium oxide dielectric films since they can be deposited in the same process chamber using the same hafnium and zirconium precursors. This could reduce or eliminate concentration gradients of contaminants between the dielectric material and the electrode material that can cause electrical problems at the interface of the materials. In addition, increased thermal stability of these materials can provide improved barrier properties against diffusion.

Conventional methods of forming CMOS devices with a mixture of Hf and Zr do not allow desired crystallographic forms (i.e., cubic and tetragonal) to be stabilized. For example, the embodiments of the present invention provide stable mixtures of Hf and Zr, by doping the combination of Hf and Zr. The doped Hf and Zr mixture is stable enough to survive the annealing to the silicon substrate. Thus, as described in further detail below for several exemplary embodiments of the present invention, the doped Hf and Zr mixture provided by the present invention allows for stable desired crystallographic forms.

Embodiments of the invention provide a method for forming doped hafnium zirconium based films that can be uniformly deposited with excellent thickness control over high aspect ratios that are envisioned in future DRAM and logic generations. Because chemical vapor deposition (CVD) and physical vapor deposition (PVD) methods of depositing high-k films are not expected to provide the needed conformality and atomic layer control over the deposition rate, ALD and PEALD methods of depositing various materials will be required for use in future generations of integrated circuits.

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Referring now to the drawings, FIG. 1A illustrates an ALD system 1 for depositing doped hafnium zirconium based films on a substrate according to one embodiment of the invention. The ALD system 1 includes a process chamber 10 having a substrate holder 20 configured to support a substrate 25, upon which the doped hafnium zirconium based film is formed. The process chamber 10 further contains an upper assembly 30 (e.g., a showerhead) coupled to a hafnium precursor supply system 40, a zirconium precursor supply system 42, a purge gas supply system 44, an oxygen-containing gas supply system 46, a nitrogen-containing gas supply system 48, and a dopant gas supply system 50. Additionally, the ALD system 1 includes a substrate temperature control system 60 coupled to substrate holder 20 and configured to elevate and control the temperature of substrate 25. Furthermore, the ALD system 1 includes a controller 70 that can be coupled to process chamber 10, substrate holder 20, assembly 30 configured for introducing process gases into the process chamber 10, hafnium precursor supply system 40, zirconium precursor supply system 42, purge gas supply system 44, oxygen-containing gas supply system 46, nitrogen-containing gas supply system 48, dopant gas supply system 50, and substrate temperature control system 60. Although not shown, the ALD system 1 can further contain an oxygen- and nitrogen-containing gas supply system.

Alternatively, or in addition, controller 70 can be coupled to one or more additional controllers/computers (not shown), and controller 70 can obtain setup and/or configuration information from an additional controller/computer.

In FIG. 1A, singular processing elements (10, 20, 30, 40, 42, 44, 46, 48, 50, and 60) are shown, but this is not required for the invention. The ALD system 1 can include any number of processing elements having any number of controllers associated with them in addition to independent processing elements.

The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1A, the ALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto. Alternately, a batch ALD system capable of processing multiple substrates simultaneously may be utilized for depositing the doped hafnium zirconium based films described in the embodiments of the invention.

The hafnium precursor supply system 40 and the zirconium precursor supply system 42 are configured to alternately or simultaneously introduce a hafnium precursor and a zirconium precursor to process chamber 10. The alternation of the introduction of the hafnium precursor and the zirconium precursor can be cyclical, or it may be acyclical with variable time periods between introduction of the hafnium and zirconium precursors.

According to embodiments of the invention, several methods may be utilized for introducing the hafnium and zirconium precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired hafnium zirconium stoichiometry can be attained within the deposited film. Another method of delivering a hafnium precursor and a zirconium precursor includes separately controlling two or more different liquid sources (neat precursors or precursors solutions), which are then mixed prior to entering a common vaporizer. This method may be utilized when the precursors are compatible in solution or in liquid form and they have similar vaporization characteristics. Yet another method of delivering a hafnium precursor and a zirconium precursor includes controlling the flow of a liquid precursor mixture (neat precursors or precursors solutions) to a common vaporizer. Other methods include the use of compatible mixed solid or liquid precursors within a bubbler. Liquid source precursors may include neat liquid hafnium and zirconium precursors, or solid or liquid hafnium and zirconium precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the hafnium and zirconium precursors within a gas pulse, it is possible to deposit hafnium zirconium based films with desired stoichiometries. According to embodiments of the invention, the hafnium zirconium based films can contain between 5 and 95 atomic percent zirconium (5%<% Zr/(% Zr+% Hf)<95%), and between 5 and 95 atomic percent hafnium (5%<% Hf/(% Zr+% Hf)<95%). Examples of dopant element concentrations in the doped hafnium zirconium based films are between 0.1 and 20 atomic percent (0.1%<% D'/(% Zr+% Hf+% D')<20%, where D' includes one or more dopant elements), or between 1 and 10 atomic percent.

Embodiments of the invention may utilize a wide variety of hafnium and zirconium precursors. For example, representative examples include: Hf(O$^t$Bu)$_4$ (hafnium tert-butoxide, HTB), Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(O$^t$Bu)$_4$ (zirconium tert-butoxide, ZTB), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Hf(mmp)$_4$, Zr(mmp)$_4$, HfCl$_4$, ZrCl$_4$, ZrCp$_2$Me$_2$, Zr(tBuCp)$_2$Me$_2$, and Zr(NiPr$_2$)$_4$. In one example, the hafnium and zirconium precursors may have the same ligands (e.g., HTB and ZTB), thereby preventing any possible detrimental ligand exchange between the precursors.

Embodiments of the invention may utilize one or more of a wide variety of different dopant elements selected from Group II, Group XIII, silicon, and rare earth elements of the Periodic Table. The dopant elements may be provided using any dopant gases that have sufficient reactivity, thermal stability, and volatility. The dopant gases may be delivered to the process chamber using bubbling or DLI methods described above for hafnium and zirconium precursors.

Embodiments of the inventions may utilize a wide variety of different rare earth precursors. For example, many rare earth precursors have the formula:

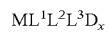

$ML^1L^2L^3D_x$ where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethyl-ether, 1,2-dimethoxyethane, diglyme, triglyme, tetraglyme, 12-Crown-6,10-Crown-4, pyridine, N-methylpyrolidine, triethylamine, trimethylamine, acetonitrile, and 2,2-dimethyl-propionitrile.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4CP)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 1A, the oxygen-containing gas supply system 46 is configured to introduce an oxygen-containing gas to the process chamber 10. The oxygen-containing gas can include, but is not limited to, $O_2$, water ($H_2O$), or peroxide ($H_2O_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethylhydrazine ($Me_2NNH_2$), and 1,2-dimethyl-hydrazine (MeNHNHMe). According to one embodiment of the invention, an oxygen- and nitrogen-containing gas may be utilized, for example, NO, $NO_2$, or $N_2O$, or a combination thereof, and optionally an inert gas such as Ar.

Embodiments of the inventions may utilize a wide variety of different Group II (alkaline earth) precursors. For example, many Group II precursors have the formula:

$ML^1L^2D_x$ where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrolidine, triethylamine, trimethylamine, acetonitrile, and 2,2-dimethylpropionitrile.

Representative examples of Group II (alkaline earth)precursors include:

Be precursors: $Be(N(SiMe_3)_2)_2$, $Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4 Cp)_2$, and $Ca(Me_5 Cp)_2$.

Sr precursors: Bis(tert-butylacetamidinato)strontium (TBAASr), Sr-C, Sr-D, $Sr(N(SiMe_3)_2)_2$, $Sr(THD)_2$, $Sr(THD)_2$(tetraglyme), $Sr(iPr_4 Cp)_2$, $Sr(iPr_3 Cp)_2$, and $Sr(Me_5 Cp)_2$.

Ba precursors: Bis(tert-butylacetamidinato)barium (TBAABa), Ba-C, Ba-D, $Ba(N(SiMe_3)_2)_2$, $Ba(THD)_2$, $Ba(THD)_2$(tetraglyme), $Ba(iPr_4 Cp)_2$, $Ba(Me_5 Cp)_2$, and $Ba(nPrMe_4 Cp)_2$.

Embodiments of the inventions may utilize a wide variety of different precursors for incorporating Group XIII elements (B, Al, Ga, In, Tl) into the hafnium zirconium based films. For example, many Al precursors have the formula:

$$AlL^1L^2L^3D_x$$

where $L^1$, $L^2$, $L^3$ are individual anionic ligands, and D is a neutral donor ligand where x can be 0,1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of Al precursors include: $Al_2Me_6$, $Al_2Et_6$, $[Al(O(sBu))_3]_4$, $Al(CH_3COCHCOCH_3)_3$, $AlBr_3$, $AlI_3$, $Al(O$ 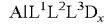$(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Ga precursors include $GaCl_3$ and $GaH_3$, examples of In precursors include $InCl_3$ and $InH_3$, and examples of B precursors include borane ($BH_3$), diborane ($B_2H_6$), tri-ethylboron ($BEt_3$), triphenylboron ($BPh_3$), borane adducts such as $Me_3N:BH_3$, and $BCl_3$.

Embodiments of the invention may utilize a wide variety of silicon precursors for incorporating silicon into the hafnium zirconium based films. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), and alkylaminosilane compounds. Examples of alkylaminosilane compounds include, but are not limited to, di-isopropylaminosilane ($H_3Si(NPr_2)$), bis (tert-butylamino)silane ($((C_4H_9(H)N)_2SiH_2)$, tetrakis(dimethylamino)silane ($Si(NMe_2)_4$), tetrakis(ethylmethylamino) silane ($Si(NEtMe)_4$), tetrakis(diethylamino)silane ($Si(NEt_2)_4$), tris(dimethylamino)silane ($HSi(NMe_2)_3$), tris (ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(di-isopropylamino)silane ($H_2Si(NPr_2)_2$), tris (isopropylamino)silane ($HSi(NPr_2)_3$), and (di-isopropylamino)silane ($H_3Si(NPr_2)$)

Still referring to FIG. 1A, the purge gas supply system 44 is configured to introduce a purge gas to process chamber 10. For example, the introduction of purge gas may occur between introduction of pulses of hafnium and zirconium precursors and an oxygen-containing gas, a nitrogen-containing gas, an oxygen- and a nitrogen-containing gas, or a dopant gas to the process chamber 10. The purge gas can comprise an inert gas, such as a noble gas (i.e., He, Ne, Ar, Kr, Xe), nitrogen ($N_2$), or hydrogen ($H_2$).

Furthermore, ALD system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the processing chamber 10 and any other component within the ALD system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular doped hafnium zirconium based material on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.). The pressure control system 32 can, for example, be configured to control the process chamber pressure between about 0.1 Torr and about 100 Torr during deposition of the doped hafnium zirconium based materials.

The hafnium precursor supply system 40, the zirconium precursor supply system 42, the purge gas supply system 44, the oxygen-containing gas supply system 46, the nitrogen-containing gas supply system 48, and the dopant gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for hafnium and zirconium precursors can be between 0.3 and 3 sec, for example 1 sec. Exemplary gas pulse lengths for a dopant gas can be between 0.1 and 3 sec, for example 0.3 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 1A, controller 70 can comprise a microprocessor, memory, and a digital I/O port capable of generating control voltages sufficient to communicate and activate inputs to the ALD system 1 as well as monitor outputs from the ALD system 1. Moreover, the controller 70 may be coupled to and may exchange information with the process chamber 10, substrate holder 20, upper assembly 30, hafnium precursor supply system 40, zirconium precursor supply system 42, purge gas supply system 44, oxygen-containing gas supply system 46, nitrogen-containing gas supply system 48, dopant gas supply system 50, substrate temperature control system 60, substrate temperature controller 60, and pressure control system 32. For example, a program stored in the memory may be utilized to activate the inputs to the aforementioned components of the deposition system 1 according to a process recipe in order to perform a deposition process.

One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the ALD system 1, or it may be remotely located relative to the ALD system 1. For example, the controller 70 may exchange data with the ALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 1B:
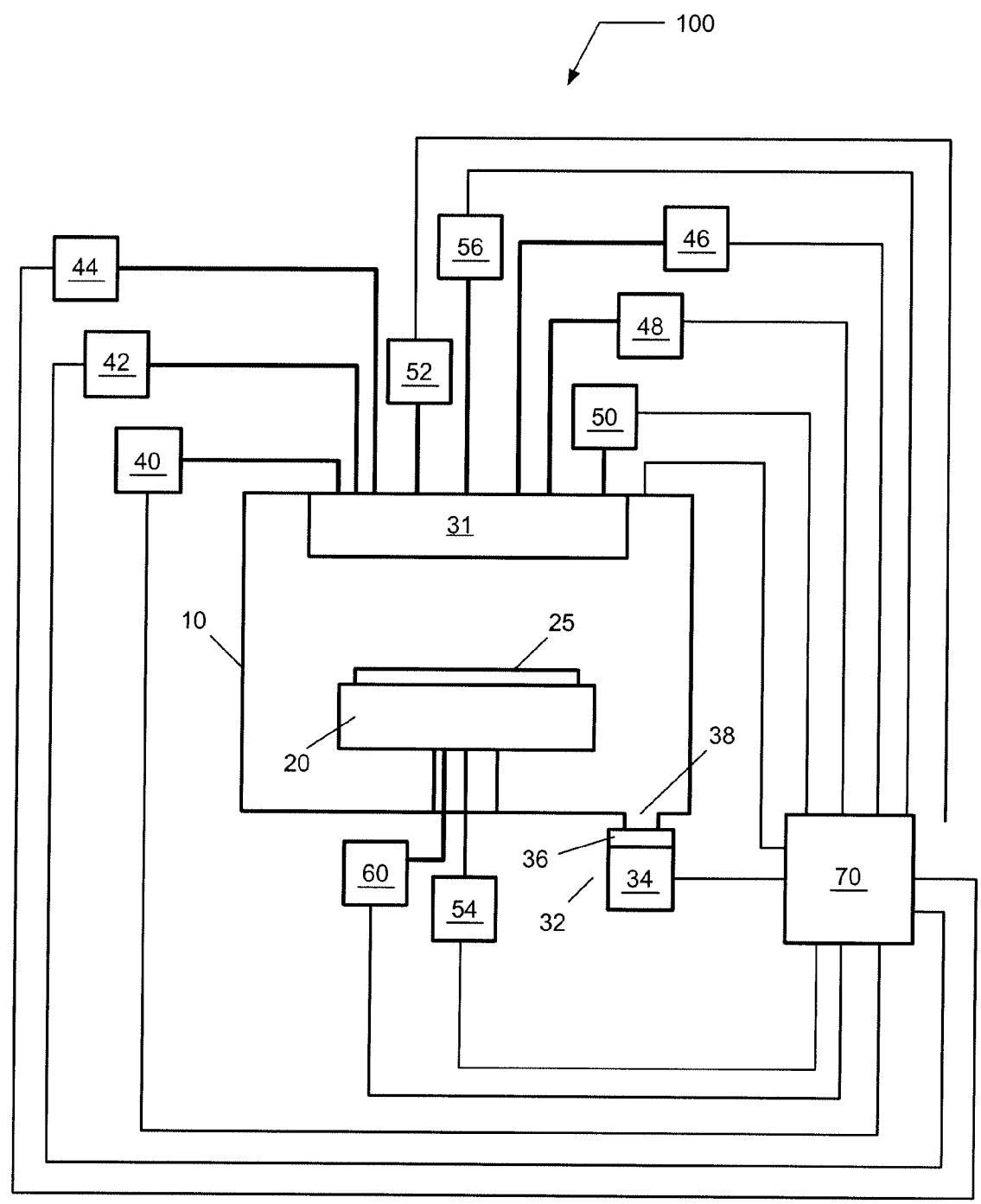
FIG. 1B depicts a schematic view of a PEALD system in accordance with an embodiment of the invention.

FIG. 1B illustrates a PEALD system 100 for depositing a doped hafnium zirconium based films on a substrate according to an embodiment of the invention. The PEALD system 100 is similar to the ALD system 1 described in FIG. 1A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

According to one embodiment of the invention, the PEALD system 100 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 25. The substrate power source 54 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1B as separate entities, they may indeed comprise one or more power sources coupled to substrate holder 20.

In addition, the PEALD system 100 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 25. The remote plasma system 56 can, for example, contain a microwave frequency generator. The process chamber pressure can be between about 0.1 Torr and about 10 Torr, or between about 0.2 Torr and about 3 Torr.

FIGS. 2A-2F schematically illustrate pulse sequences for forming doped hafnium zirconium based films according to embodiments of the invention. According to embodiments of the invention, sequential and alternating pulse sequences are used to deposit the different components (i.e., hafnium, zirconium, dopant elements, oxygen, and nitrogen) of the doped hafnium zirconium based films. Since ALD and PEALD processes typically deposit less than a monolayer of material per gas pulse, it is possible to form a homogenous material using separate deposition sequences of the different components of the film. Depending on the gas selections and combination of pulse sequences, doped hafnium zirconium materials may be formed that include doped hafnium zirconium oxide films, doped hafnium zirconium nitride films, and doped hafnium zirconium oxynitride films.

Figure 2A:
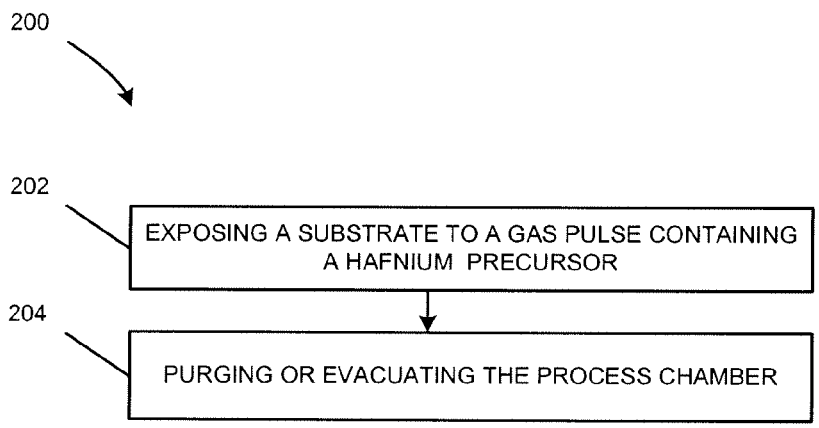
FIGS. 2A-2F schematically illustrate pulse sequences for forming doped hafnium zirconium based films according to embodiments of the invention.
Figure 2B:
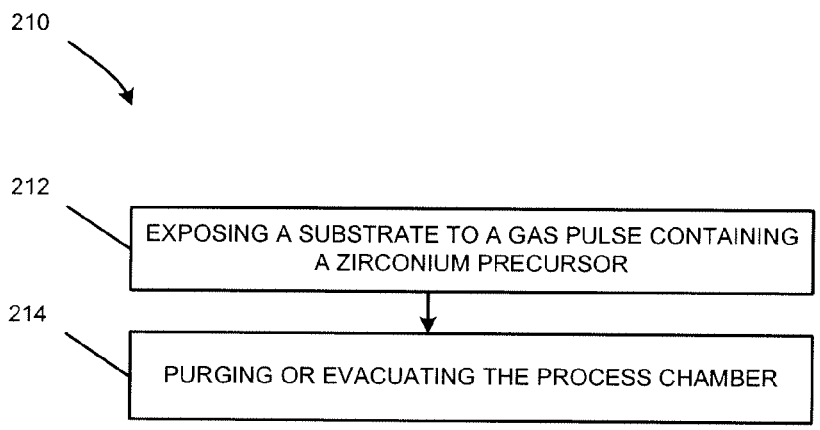
Figure 2C:
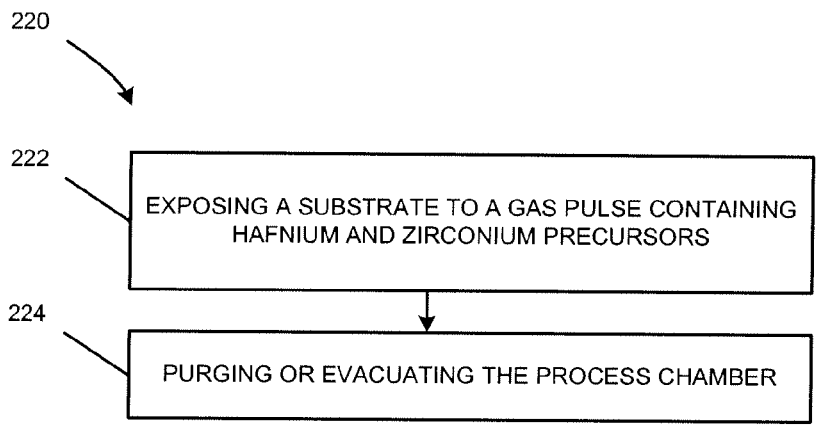
Figure 2D:
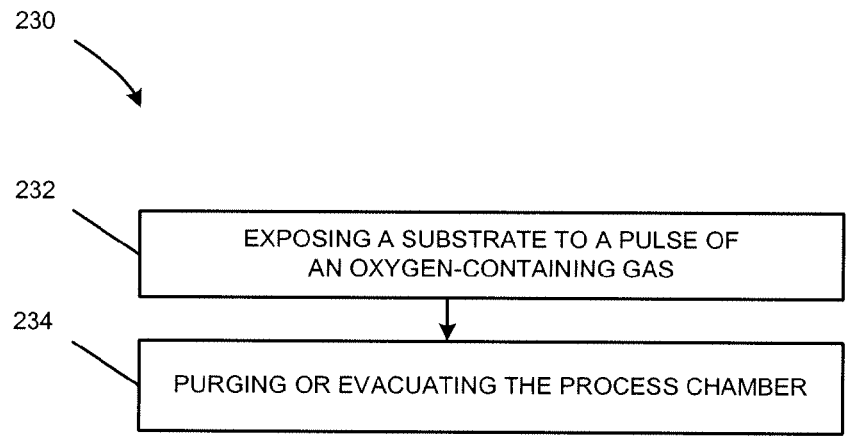
Figure 2E:
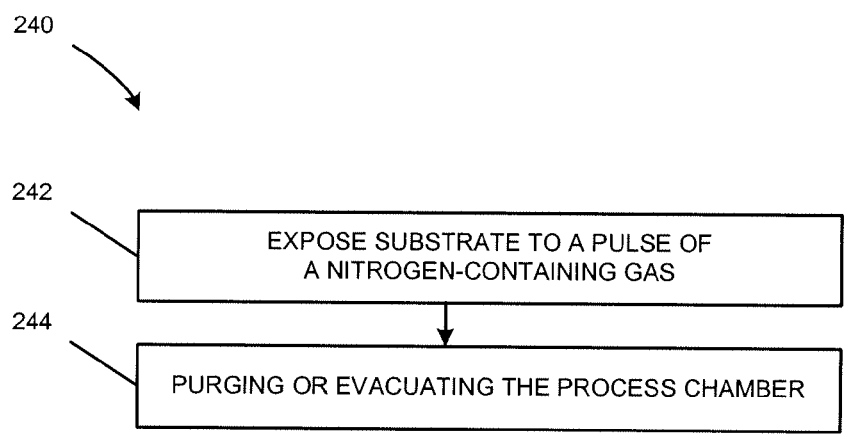
Figure 2F:
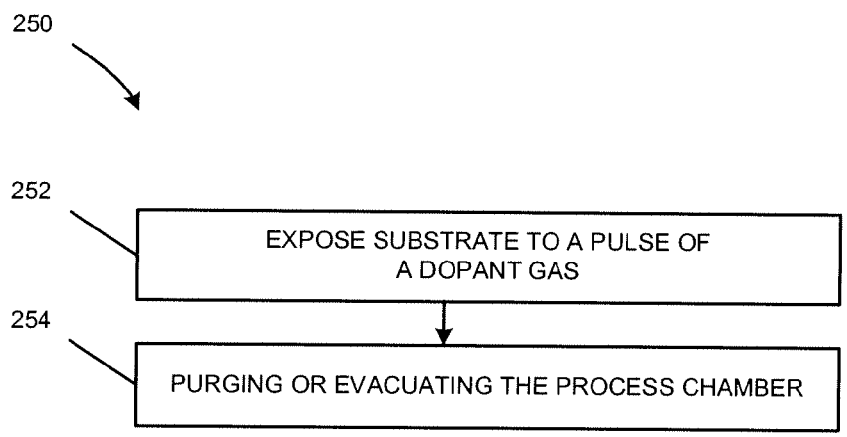

FIG. 2A depicts a pulse sequence 200 for depositing a hafnium element from a hafnium precursor in step 202. FIG. 2B depicts a pulse sequence 210 for depositing a zirconium element from a zirconium precursor in step 212. FIG. 2C depicts a pulse sequence 220 for simultaneously depositing hafnium and zirconium elements from hafnium and zirconium precursors in step 222. FIG. 2D depicts a pulse sequence 230 for incorporating oxygen into a hafnium zirconium based film from exposure to an oxygen-containing gas in step 232. FIG. 2E depicts a pulse sequence 240 for incorporating nitrogen into a hafnium zirconium based film from exposure to a nitrogen-containing gas in step 242. FIG. 2F depicts a pulse sequence 250 for depositing one or more dopant elements from a dopant gas in step 252.

According to the embodiments depicted in FIGS. 2A-2F, each of the pulse sequences 200, 210, 220, 230, 240, and 250 may include a respective purge or evacuation step 204, 214, 224, 234, 244, 254 to remove unreacted gas or byproducts from the process chamber. According to another embodiment of the invention, one or more of the purge or evacuation steps 204, 214, 224, 234, 244, 254 may be omitted.

According to embodiments of the invention, different combinations of the pulse sequences depicted in FIGS. 2A-2F may be utilized for depositing different doped hafnium zirconium based materials, including doped hafnium zirconium oxides ($Hf_xZr_yD'_kO_m$, where D' contains one or more dopant elements and x, y, k, and m are non-zero numbers), doped hafnium zirconium nitrides ($Hf_xZr_yD'_kN_n$, where x, y, k, and n are non-zero numbers), and doped hafnium zirconium oxynitrides ($Hf_xZr_yD'_kO_mN_n$, where x, y, k, o, and m are non-zero numbers). Below are exemplary doped hafnium zirconium based materials that may be deposited by the teachings of embodiments of the invention. As those skilled in the art will readily recognize, a wide variety of other doped hafnium zirconium based materials not shown below may be deposited. Furthermore, impurities such as carbon and halides may be incorporated into these materials from the precursor ligands. Therefore, embodiments of the invention are not limited to the materials listed below. For example, other doped hafnium zirconium based materials may contain one or more dopant elements D', for example two, three, four, or more.

Examples of Doped Hafnium Zirconium Based Materials

Doped Hafnium Zirconium Oxides: $Hf_xZr_ySi_kO_m$, $Hf_xZr_yAl_kO_m$, $Hf_xZr_yY_kO_m$, and $Hf_xZr_yMg_kO_m$.

Doped Hafnium Zirconium Nitrides: $Hf_xZr_ySi_kN_n$, $Hf_xZr_yAl_kN_n$, $Hf_xZr_yY_kN_n$, and $Hf_xZr_yMg_kN_n$.

Doped Hafnium Zirconium Oxynitrides: $Hf_xZr_ySi_kO_mN_n$, $Hf_xZr_yAl_kO_mN_n$, $Hf_xZr_yY_kO_mN_n$, and $Hf_xZr_yMg_kO_mN_n$.

Doped Hafnium Zirconium Oxide Films

FIGS. 3A-3D are process flow diagrams for forming doped hafnium zirconium oxide films according embodiments of the invention. The process flows of FIGS. 3A-3D may be performed by the ALD/PEALD systems 1/101 of FIGS. 1, 2, or any other suitable ALD/PEALD systems configured to perform an ALD/PEALD process.

Figure 3A:
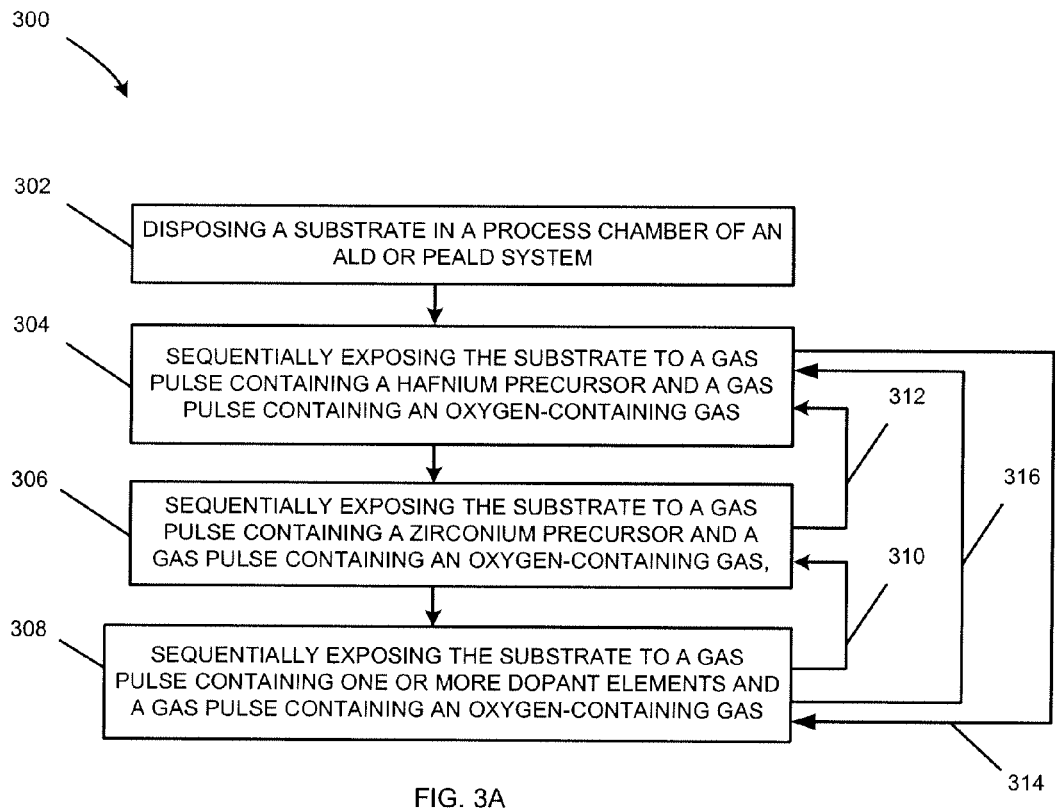
FIGS. 3A-3B are process flow diagrams for forming doped hafnium zirconium oxide films according to embodiments of the invention.

In FIG. 3A, the process 300 begins when a substrate, such as a semiconductor substrate, is disposed in a process chamber of an ALD or PEALD system in step 302. In step 304, the substrate is sequentially exposed to a gas pulse containing a hafnium precursor and a gas pulse containing an oxygen-containing gas. In step 306, the substrate is sequentially exposed to a gas pulse containing a zirconium precursor and a gas pulse containing the oxygen-containing gas. In step 308, the substrate is sequentially exposed to a gas pulse containing one or more dopant elements and a gas pulse containing the oxygen-containing gas. The oxygen-containing gas can include $O_2$, $H_2O$, $H_2O_2$, ozone, or plasma excited oxygen, or a combination thereof, and optionally an inert gas such as Ar.

In step 304, the hafnium precursor reacts with the surface of the heated substrate to form a chemisorbed layer less than a monolayer thick containing the hafnium metal element. The chemisorbed layer is less than a monolayer thick due to the large size of the precursor compared to the size of the hafnium metal element. Next, oxygen from the gas pulse containing oxygen-containing gas reacts with the chemisorbed surface layer and generates a hydroxylated surface. By repeating this sequential gas exposure, i.e., by alternating the two exposures a plurality of times, it is possible to achieve layer by layer growth of about 1 angstrom ($10^{-10}$ m) per cycle. As will be described below, according to another embodiment of the invention, the process chamber may be purged or evacuated to removing any unreacted hafnium and zirconium precursor, byproducts, and oxygen-containing gas from the process chamber between the sequential and alternating gas pulses.

According to embodiments of the invention, the sequential exposure steps 304, 306, 308 may be repeated a predetermined number of times, as shown by the process flow arrow 314, until a doped hafnium zirconium oxide film ($Hf_xZr_yD'_kO_m$, where x, y, k, and m are non-zero numbers) with a desired thickness has been formed. The desired film thickness can depend on the type of semiconductor device or device region being formed. For example, the film thickness can be between about 5 angstroms and about 200 angstroms, between about 5 angstroms and about 40 angstroms, or between about 5 angstroms and about 15 angstroms.

According the embodiment depicted in FIG. 3A, the process flow 300 includes a deposition cycle containing sequential and alternating exposures of a gas pulse containing a hafnium precursor, a gas pulse containing an oxygen-containing gas, a gas pulse containing a zirconium precursor, a gas pulse containing an oxygen-containing gas, a gas pulse containing one or more dopant elements, and a gas pulse containing an oxygen-containing gas. According to another embodiment of the invention, the order of the sequential and alternating exposure steps 304, 306, 308 of the deposition cycle can be changed to effect film growth and film composition.

According to one embodiment of the invention, each of the sequential exposure steps 304, 306, 308 may be independently repeated a predetermined number of times. In one example, if step 304 is denoted by pulse sequence A, step 306 is denoted by a pulse sequence B, and step 308 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium oxide films containing different amounts and different depth profiles of hafnium, zirconium, dopant elements, and oxygen in the resulting doped hafnium zirconium oxide film.

According to another embodiment of the invention, additional pulse sequences containing additional dopant elements may be added to the process flow depicted in FIG. 3A to form doped hafnium zirconium oxide films containing additional dopant elements. In other words, additional dopant elements may be incorporated into the films by adding pulse sequences containing a gas pulse containing the additional dopant elements and gas pulse containing an oxygen-containing gas. In one example, a pulse sequence C containing a gas pulse containing additional dopant elements and a gas pulse containing an oxygen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 300 may further include steps of purging or evacuating the process chamber after each gas pulse. The purging or evacuating steps can aid in removing any unreacted hafnium precursor, zirconium precursor, byproducts, dopant gas, and oxygen-containing gas from the process chamber between the alternating pulses of hafnium precursor, zirconium precursor, oxygen-containing gas, and dopant gas.

The exposure steps 304 and 306 may be repeated in sequence a predetermined number of times, as shown by the process flow arrow 312, and exposure steps 306 and 308 may be repeated in sequence a predetermined number of times, as shown by the process flow arrow 310, and exposure steps 304 and 308 may be repeated in sequence a predetermined number of times, as shown by the process flow arrow 314. Furthermore, the exposure steps 304, 306, 308 may be repeated a predetermined number of times as shown by the process arrow 316.

Figure 3B:
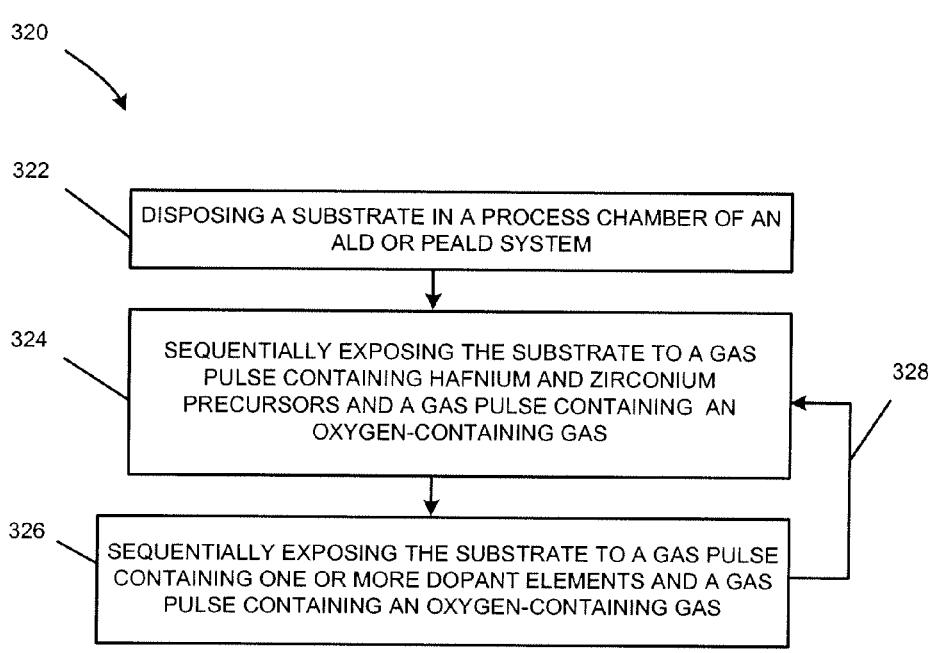

FIG. 3B is a process flow diagram for forming a doped hafnium zirconium oxide film according to yet another embodiment of the invention. As seen in FIG. 3B, the process 320 begins when a substrate, such as a semiconductor substrate, is disposed in a process chamber of an ALD or PEALD system in step 322.

In step 324, the substrate is sequentially exposed to a gas pulse containing hafnium and zirconium precursors and a gas pulse with an oxygen-containing gas. The relative concentration of the hafnium and zirconium precursors may be independently controlled to tailor the composition of the resulting doped hafnium zirconium oxide film. In step 326, the substrate is sequentially exposed to a gas pulse containing one or more dopant elements and gas pulse containing an oxygen-containing gas. According to one embodiment of the invention, the sequential exposure steps 324 and 326 may be repeated a predetermined number of times as depicted by the process flow arrow 328. Furthermore, each of the exposure steps 324 and 326 may be independently repeated a predetermined number of times.

In alternative embodiments, the hafnium and zirconium precursors may be pulsed together, and either or both may be pulsed with the one or more dopant elements to deposit a doped hafnium zirconium oxide film.

According to another embodiment of the invention, the process flow 320 may further include steps of purging or evacuating the process chamber after each gas pulse. The purging or evacuating steps can aid in removing any unreacted hafnium precursor, zirconium precursor, byproducts, oxygen-containing gas, and dopant gas from the process chamber.

Doped Hafnium Zirconium Nitride Films

Figure 4A:
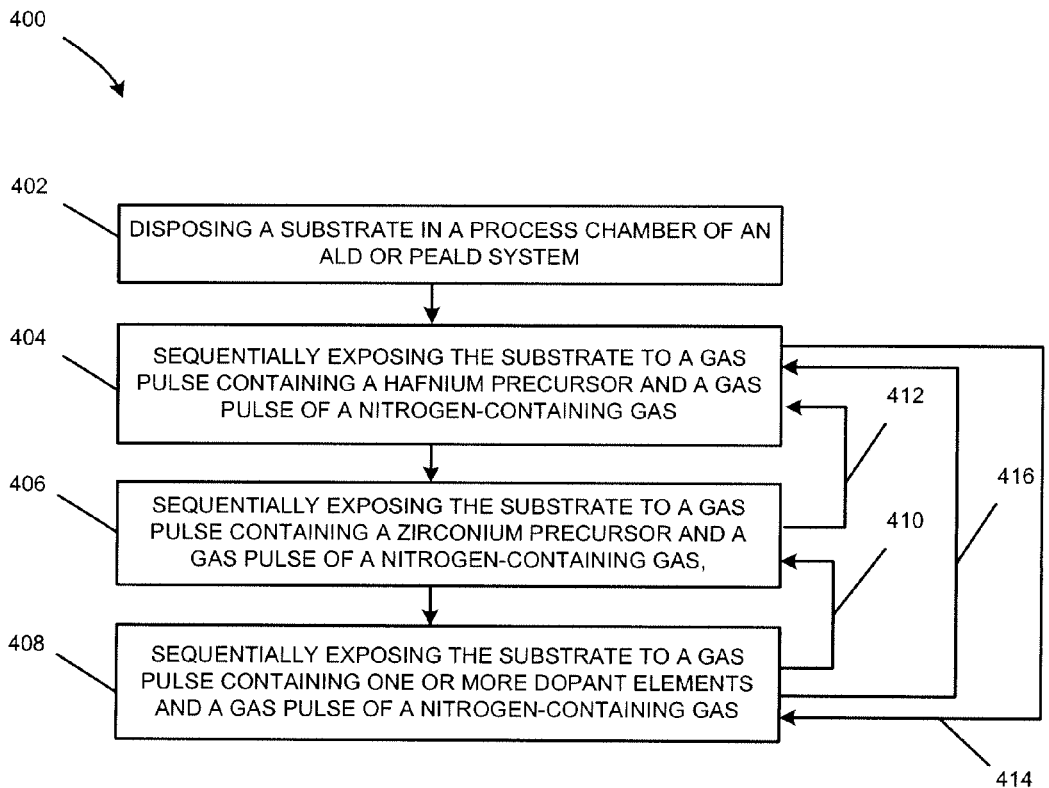
FIGS. 4A-4B are process flow diagrams for forming doped hafnium zirconium nitride films according to embodiments of the invention.
Figure 4B:
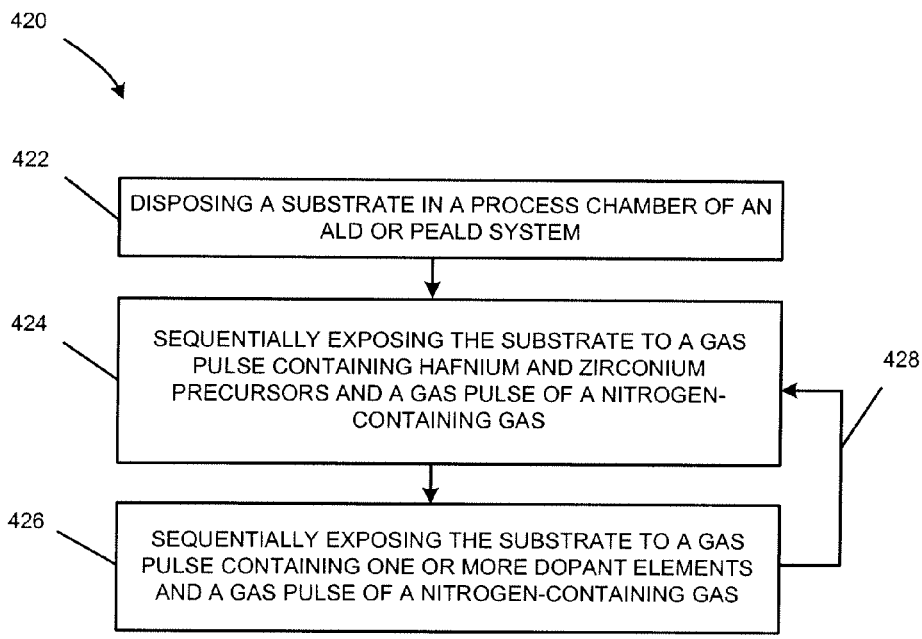

FIGS. 4A-4B are process flow diagrams for forming doped hafnium zirconium nitride films according embodiments of the invention. The process flows of FIG. 4A-4B may be performed by the ALD/PEALD systems 1/101 of FIGS. 1, 2, or any other suitable ALD/PEALD systems configured to perform an ALD/PEALD process.

In FIG. 4A, the process 400 begins when a substrate, such as a semiconductor substrate, is disposed in a process chamber of an ALD or PEALD system in step 402. In step 404, the substrate is sequentially exposed to a gas pulse containing a hafnium precursor and a gas pulse containing a nitrogen-containing gas. In step 406, the substrate is sequentially exposed to a gas pulse containing a zirconium precursor and a gas pulse containing the nitrogen-containing gas. In step 408, the substrate is sequentially exposed to a gas pulse containing one or more dopant elements and a gas pulse containing the nitrogen-containing gas. The nitrogen-containing gas can include $NH_3$, $N_2H_4$, $C_1$-$C_{10}$ alkylhydrazine compounds, or plasma excited nitrogen, or a combination thereof. According to one embodiment, the nitrogen-containing gas may further contain plasma excited hydrogen. Alternately, the nitrogen-containing gas may be replaced by plasma excited hydrogen.

In step 404, the hafnium precursor reacts with the surface of the heated substrate to form a chemisorbed layer less than a monolayer thick containing the hafnium metal element. The substrate surface may contain hydroxyl groups. The chemisorbed layer is less than a monolayer thick due to the large size of the precursor compared to the size of the hafnium metal element. Next, nitrogen from the gas pulse containing the nitrogen-containing gas reacts with the chemisorbed surface layer and forms a nitrogen-terminated surface. By repeating this sequential gas exposure, i.e., by alternating the two exposures a plurality of times, it is possible to achieve layer by layer growth of about 1 angstrom ($10^{-10}$ m) per cycle. As will be described below, according to another embodiment of the invention, the process chamber may be purged or evacuated to removing any unreacted hafnium precursor, zirconium precursor, byproducts, nitrogen-containing gas, and dopant gas from the process chamber between the sequential and alternating gas pulses.

According to embodiments of the invention, the sequential exposure steps 404, 406, 408 may be repeated a predetermined number of times, as shown by the process flow arrow 414, until a doped hafnium zirconium nitride film ($Hf_xZr_yD'_kN_n$, where x, y, k, and n are non-zero numbers) with a desired thickness has been formed. The desired film thickness can depend on the type of semiconductor device or device region being formed. For example, the film thickness can be between about 5 angstroms and about 200 angstroms, between about 5 angstroms and about 40 angstroms, or between about 5 angstroms and about 15 angstroms.

According the embodiment depicted in FIG. 4A, the process flow 400 includes a deposition cycle containing sequential and alternating exposures of a gas pulse containing a hafnium precursor, a gas pulse containing a nitrogen-containing gas, a gas pulse containing a zirconium precursor, a gas pulse containing a nitrogen-containing gas, a gas pulse containing a one or more dopant elements, and a gas pulse containing a nitrogen-containing gas. According to another embodiment of the invention, the order of the sequential and alternating exposure steps 404, 406, 408 of the deposition cycle can be changed to effect film growth and film composition.

According to one embodiment of the invention, each of the sequential exposure steps 404, 406, 408 may be independently repeated a predetermined number of times. In one example, if step 404 is denoted by pulse sequence A, step 406 is denoted by a pulse sequence B, and step 408 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium nitride films containing different amounts and different depth profiles of hafnium, zirconium, one or more dopant elements, and nitrogen in the resulting doped hafnium zirconium nitride film.

According to another embodiment of the invention, additional pulse sequences containing additional dopant elements may be added to the process flow depicted in FIG. 4A to form doped hafnium zirconium nitride films containing a additional dopant elements. In other words, additional dopant elements may be incorporated into the films by adding pulse sequences containing a gas pulse containing the additional dopant elements and gas pulse containing a nitrogen-containing gas. In one example, a pulse sequence C containing a gas pulse containing additional dopant elements and a gas pulse containing a nitrogen-containing gas may be added. Thus, one deposition cycle can, for example, include ABCX, ABBCX, ABCCX, etc. However, embodiments of the invention are not limited to these deposition cycles, as other combinations of A, B, C, and X may be utilized.

According to another embodiment of the invention, the process flow 400 may further include steps of purging or evacuating the process chamber after each gas pulse. The purging or evacuating steps can aid in removing any unreacted hafnium precursor, zirconium precursor, byproducts, dopant gas, and nitrogen-containing gas from the process chamber between the alternating gas pulses of hafnium precursor, zirconium precursor, nitrogen-containing gas, and one or more dopant elements.

The exposure steps 404 and 406 may be repeated in sequence a predetermined number of times, as shown by the process flow arrow 412, and exposure steps 406 and 408 may be repeated in sequence a predetermined number of times, as shown by the process flow arrow 410, and exposure steps 404 and 408 may be repeated in sequence a predetermined number of times, as shown by the process flow arrow 414. Furthermore, the exposure steps 404, 406, 408 may be repeated a predetermined number of times as shown by the process arrow 416.

FIG. 4B is a process flow diagram for forming a doped hafnium zirconium oxide film according to yet another embodiment of the invention. As seen in FIG. 4B, the process 420 begins when a substrate, such as a semiconductor substrate, is disposed in a process chamber of an ALD or PEALD system in step 422.

In step 424, the substrate is sequentially exposed to a gas pulse containing hafnium and zirconium precursors and a gas pulse with a nitrogen-containing gas. The relative concentration of the hafnium and zirconium precursors may be independently controlled to tailor the composition of the resulting doped hafnium zirconium nitride film. In step 426, the substrate is sequentially exposed to a gas pulse containing a one or more dopant elements and gas pulse containing an a nitrogen-containing gas. According to one embodiment of the invention, the sequential exposure steps 424 and 426 may be repeated a predetermined number of times as depicted by the process flow arrow 428. Furthermore, each of the exposure steps 424 and 426 may be independently repeated a predetermined number of times.

In alternative embodiments, the hafnium and zirconium precursors may be pulsed together, and either or both may be pulsed with the one or more dopant elements to deposit a doped hafnium zirconium nitride film.

According to another embodiment of the invention, the process flow 420 may further include steps of purging or evacuating the process chamber after each gas pulse. The purging or evacuating steps can aid in removing any unreacted hafnium precursor, zirconium precursor, byproducts, nitrogen-containing gas, and dopant gas from the process chamber.

Doped Hafnium Zirconium Oxynitride Films

Figure 5A:
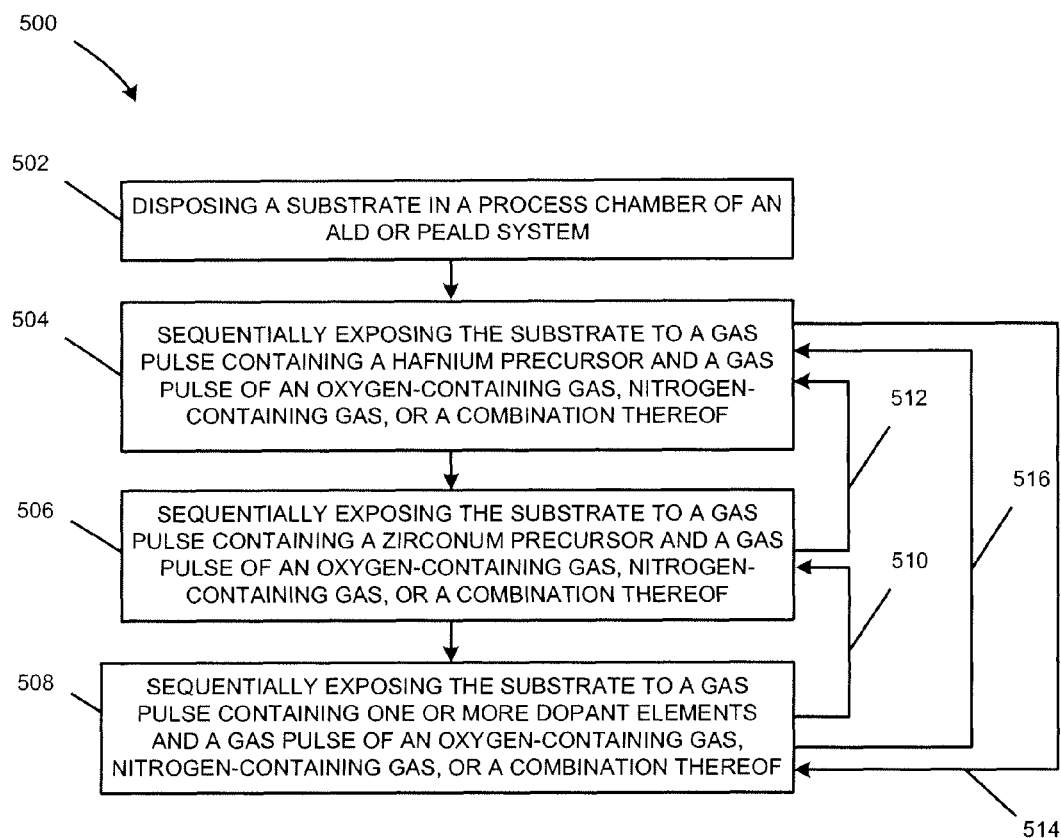
FIGS. 5A-5B are process flow diagrams for forming doped hafnium zirconium oxynitride films according to embodiments of the invention.
Figure 5B:
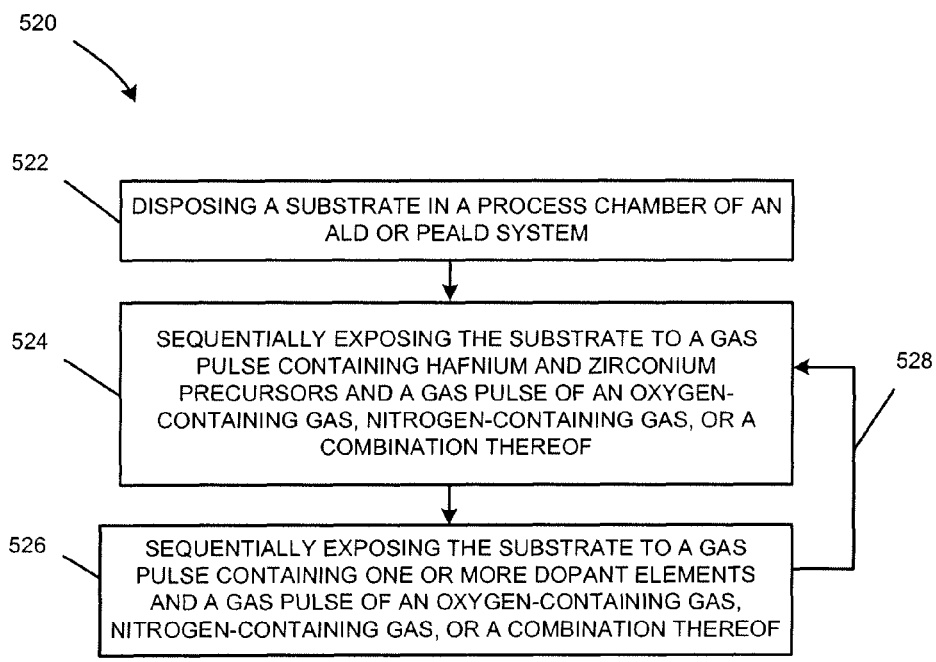

FIGS. 5A-5B are process flow diagrams for forming doped hafnium zirconium oxynitride films according embodiments of the invention. The process flows of FIG. 5A-5B may be performed by the ALD/PEALD systems 1/101 of FIGS. 1, 2, or any other suitable ALD/PEALD systems configured to perform an ALD/PEALD process.

In FIG. 5A, the process 500 begins when a substrate, such as a semiconductor substrate, is disposed in a process chamber of an ALD or PEALD system in step 502. In step 504, the substrate is sequentially exposed to a gas pulse containing a hafnium precursor and a gas pulse containing an oxygen-containing gas, a nitrogen-containing gas, or an oxygen and nitrogen-containing gas. In step 506, the substrate is sequentially exposed to a gas pulse containing a zirconium precursor and gas pulse containing the oxygen-containing gas, the nitrogen-containing gas, or the oxygen and nitrogen-containing gas. In step 508, the substrate is sequentially exposed to gas pulse containing one or more dopant elements and a gas pulse containing the oxygen-containing gas, the nitrogen-containing gas, or the oxygen and nitrogen-containing gas. The oxygen-containing gas can include $O_2$, $H_2O$, $H_2O_2$, ozone, or plasma excited oxygen, or a combination thereof, and optionally an inert gas such as Ar. The nitrogen-containing gas can contain $NH_3$, $N_2H_4$, $C_1$-$C_{10}$ alkylhydrazine compounds, or plasma excited nitrogen, or a combination thereof, and optionally an inert gas such as Ar. The oxygen- and nitrogen-containing gas can contain NO, $NO_2$, or $N_2O$, or a combination thereof. In order to incorporate oxygen and nitrogen into the film, the combination of steps 504, 506, and 508 should include at least one gas pulse containing oxygen and at least one gas pulse containing nitrogen.

According to embodiments of the invention, the sequential exposure steps 504, 506, 508 may be repeated a predetermined number of times, as shown by the process flow arrow 514, until a doped hafnium zirconium oxynitride film ($Hf_xZr_yD'_kO_mN_n$, where x, y, k, m, and n are non-zero numbers) with a desired thickness has been formed. The desired film thickness can depend on the type of semiconductor device or device region being formed. For example, the film thickness can be between about 5 angstroms and about 200 angstroms, between about 5 angstroms and about 40 angstroms, or between about 5 angstroms and about 15 angstroms.

According the embodiment depicted in FIG. 5A, the process flow includes a deposition cycle containing sequential and alternating exposures of a gas pulse containing a hafnium precursor, gas pulse containing an oxygen-containing gas, a nitrogen-containing gas, or an oxygen- and nitrogen-containing gas, a gas pulse containing a zirconium precursor, a gas pulse containing an oxygen-containing gas, a nitrogen-containing gas, or an oxygen- and nitrogen-containing gas, a gas pulse containing an dopant gas, and a gas pulse containing an oxygen-containing gas, a nitrogen-containing gas, or an oxygen- and nitrogen-containing gas. According to another embodiment of the invention, the order of the sequential and alternating exposure steps 504, 506, 508 of the deposition cycle can be changed to effect film growth and film composition.

According to one embodiment of the invention, each of the sequential exposure steps 504, 506, 508 may be independently repeated a predetermined number of times. In one example, if step 504 is denoted by pulse sequence A, step 506 is denoted by a pulse sequence B, and step 508 is denoted by pulse sequence X, a deposition cycle can include ABX where ABX may be repeated a predetermined number of times (i.e., ABXABXABX etc.) until the desired film is formed. As those skilled in the art will readily recognize, a wide variety of other deposition cycles are possible including, for example, AABXAABX, ABBXABBX, ABXXABXX, AABXABBX, etc. However, embodiments of the invention are not limited to these deposition cycles, as other combinations of A, B, and X may be utilized. Using these different deposition cycles, it is possible to deposit doped hafnium zirconium oxynitride films containing different amounts and different depth profiles of hafnium, zirconium, the one or more dopant elements, nitrogen, and oxygen in the resulting doped hafnium zirconium oxynitride film.

According to another embodiment of the invention, additional pulse sequences containing additional dopant elements may be added to the process flow depicted in FIG. 5A to form doped hafnium zirconium oxynitride films additional dopant elements. In other words, additional dopant elements may be incorporated into the films by adding pulse sequences containing sequential exposures of a gas pulse containing the additional dopant elements and an oxygen-containing gas, a nitrogen-containing gas, or an oxygen- and nitrogen-containing gas for each additional dopant element to be incorporated into the film. In one example, a pulse sequence C containing a gas pulse containing a second dopant gas and an oxygen-, nitrogen- or oxygen and nitrogen-containing gas may be added. Thus, one deposition cycle can, for example, include ABCX, ABBCX, ABCCX, ABCXX, etc. However, embodiments of the invention are not limited to these deposition cycles, as other combinations of A, B, C, and X may be utilized.

According to another embodiment of the invention, the process flow 500 may further include steps of purging or evacuating the process chamber after each gas pulse. The purging or evacuating steps can aid in removing any unreacted hafnium precursor, zirconium precursor, byproducts, dopant gas, oxygen-containing gas, nitrogen-containing gas, or oxygen- and nitrogen-containing gas from the process chamber between the alternating gas pulses.

The exposure steps 504 and 506 may be repeated in sequence a predetermined number of times, as shown by the process flow arrow 512, exposure steps 506 and 508 may be repeated in sequence a predetermined number of times, as shown by the process flow arrow 510, and exposure steps 504 and 508 may be repeated in sequence a predetermined number of times, as shown by the process flow arrow 514. Furthermore, the exposure steps 504, 506, 508 may be repeated a predetermined number of times as shown by the process arrow 516.

FIG. 5B is a process flow diagram for forming a doped hafnium zirconium oxynitride films according to yet another embodiment of the invention. As seen in FIG. 5B, the process 520 begins when a substrate, such as a semiconductor substrate, is disposed in a process chamber of an ALD or PEALD system in step 522.

In step 524, the substrate is simultaneously exposed to a gas pulse containing hafnium and zirconium precursors and a gas pulse containing an oxygen-containing gas, a nitrogen-containing gas, or an oxygen- and nitrogen-containing gas. The relative concentration of the hafnium and zirconium precursors may be independently controlled to tailor the composition of the resulting doped hafnium zirconium oxynitride film. In step 526, the substrate is sequentially exposed to a gas pulse containing an dopant gas and an a gas pulse containing an oxygen-containing gas, a nitrogen-containing gas, or an oxygen- and nitrogen-containing gas. According to one embodiment of the invention, the sequential exposure steps 524 and 526 may be repeated a predetermined number of times as depicted by the process flow arrow 528.

In alternative embodiments, the hafnium and zirconium precursors may be pulsed together, and either or both may be pulsed with the one or more dopant elements to deposit a doped hafnium zirconium oxynitride film.

According to another embodiment of the invention, the process flow 520 may further include steps of purging or evacuating the process chamber after each gas pulse. The purging or evacuating steps can aid in removing any unreacted hafnium and zirconium precursors, byproducts, oxygen-containing gas, nitrogen-containing gas, oxygen- and nitrogen-containing gas, and dopant gas from the process chamber.

According to one embodiment of the invention, the deposited doped hafnium zirconium oxide, nitride, and oxynitride films may be further processed by exposing the films to ozone, plasma excited oxygen, or plasma excited nitrogen, or a combination thereof. This post-treating can be utilized to further incorporate oxygen, nitrogen, or both oxygen and nitrogen into the films.

Figure 6A:
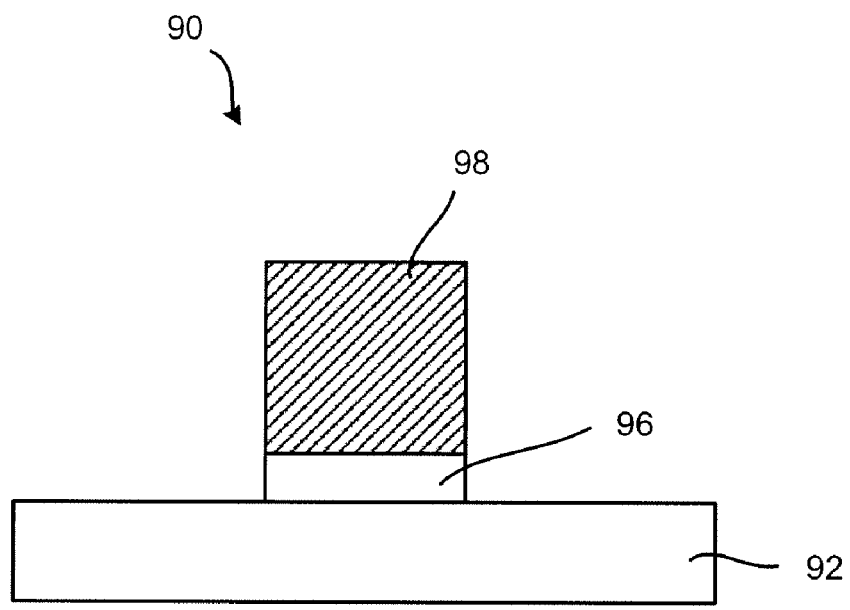
FIGS. 6A and 6B schematically show cross-sectional views of semiconductor devices containing doped hafnium zirconium based materials according to embodiments of the invention.
Figure 6B:
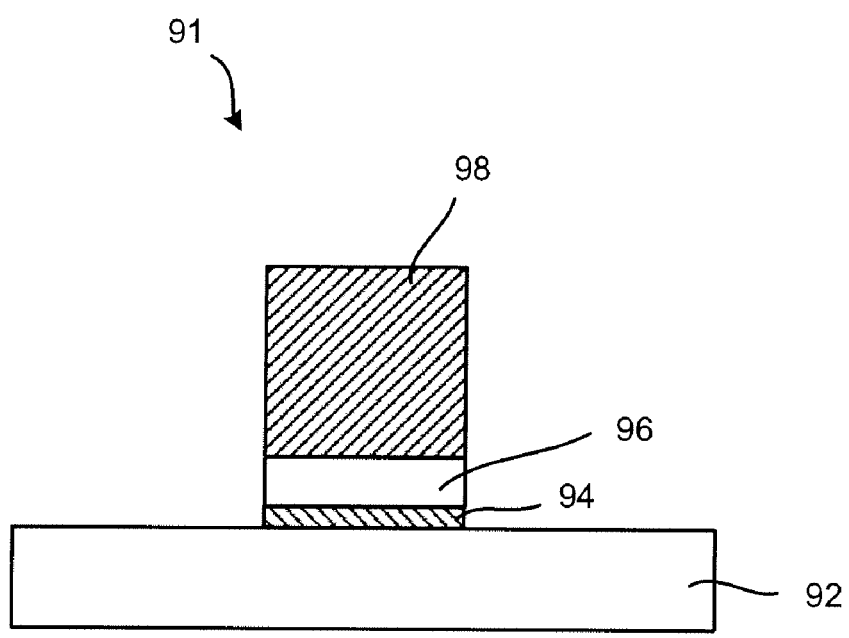

FIGS. 6A and 6B schematically show cross-sectional views of semiconductor devices containing doped hafnium zirconium based materials according to embodiments of the invention. In the schematic cross-sectional views, source and drain regions of the field emission transistors (FET) 90 and 91 are not shown. The FET 90 in FIG. 9A contains a semiconductor substrate 92, a doped hafnium zirconium oxide film 96 that serves as a gate dielectric, and a conductive gate electrode film 98 over the film 96. A thickness of the film 96 can be between about 5 and about 200 angstroms, between about 5 and about 40 angstroms, or between about 5 and about 15 angstroms.

The FET 90 further contains a gate electrode film 98 that can, for example, be between about 5 nm and about 10 nm thick and can contain poly-Si, a metal, or a metal-containing material, including W, WN, WSi$_x$, Al, Mo, Ta, TaN, TaSiN, HfN, HfSiN, Ti, TiN, TiSiN, Mo, MoN, Re, Pt, or Ru. According to other embodiments of the invention, the gate electrode film 98 can be a doped hafnium zirconium nitride film or a doped hafnium zirconium oxynitride film.

The FET 91 in FIG. 6B is similar to the FET 90 in FIG. 6A but further contains an interface layer 94 between the doped hafnium zirconium oxide film 96 and the substrate 92. The interface layer 94 can, for example, be an oxide layer, a nitride layer, or an oxynitride layer.

According to other embodiments of the invention, the semiconductor devices can contain capacitors containing the doped hafnium zirconium based materials.

Although only certain exemplary embodiments of inventions have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device comprising:
    a substrate;
    a gate dielectric over the substrate, wherein the gate dielectric comprises a doped hafnium zirconium oxide film containing one or more dopant elements selected from Be, Mg, Ca, Sr, Ba, Ra, B, Ga, In, Tl, Y, Lu, La, Ce, Pr, Nd, Sm, Eu, Gd, Tb, Dy, Ho, Er, Tm, and Yb; and
    a conductive gate electrode film over the gate dielectric,
    wherein the doped hafnium zirconium oxide film forms a stable cubic or tetragonal form that survives annealing to the substrate.
2. The device of claim 1, wherein the device is a transistor.
3. The device of claim 1, wherein the device is a capacitor.
4. The device of claim 1, wherein the doped hafnium zirconium oxide film has a thickness between about 5 and about 200 angstroms.
5. The device of claim 1, wherein the doped hafnium zirconium oxide film has a thickness between about 5 and about 40 angstroms.

6. The device of claim 1, wherein the doped hafnium zirconium oxide film has a thickness between about 5 and about 15 angstroms.

7. The device of claim 1, further comprising an interface layer between the substrate and the gate dielectric, wherein the interface layer comprises an oxide layer, a nitride layer, or an oxynitride layer.

8. The device of claim 1, wherein the conductive gate electrode film is selected from poly-Si, W, WN, $WSi_x$, Al, Mo, Ta, TaN, TaSiN, MN, HfSiN, Ti, TiN, TiSiN, Mo, MoN, Re, Pt, Ru, doped hafnium zirconium nitride, or doped hafnium zirconium oxynitride.

9. A semiconductor device comprising:
a substrate;
a gate dielectric over the substrate, wherein the gate dielectric comprises a doped hafnium zirconium oxide film of the following formula:

$$Hf_xZr_yD'_kO_m$$

wherein D' includes one or more dopant elements selected from Be, Mg, Ca, Sr, Ba, Ra, B, Ga, In, Tl, Y, Lu, La, Ce, Pr, Nd, Sm, Eu, Gd, Tb, Dy, Ho, Er, Tm, and Yb, and wherein x, y, k, and m are non-zero numbers; and
a conductive gate electrode film over the gate dielectric, wherein the doped hafnium zirconium oxide film forms a stable cubic or tetragonal form that survives annealing to the substrate.

10. The device of claim 9, wherein the doped hafnium zirconium oxide film has a thickness between about 5 and about 200 angstrom.

11. The device of claim 9, wherein the doped hafnium zirconium oxide film has a thickness between about 5 and about 40 angstrom.

12. The device of claim 9, wherein the doped hafnium zirconium oxide film has a thickness between about 5 and about 15 angstrom.

13. The device of claim 9, further comprising an interface layer between the substrate and the gate dielectric, wherein the interface layer comprises an oxide layer, a nitride layer, or an oxynitride layer.

14. The device of claim 9, wherein the conductive gate electrode film is selected from poly-Si, W, WN, $WSi_x$, Al, Mo, Ta, TaN, TaSiN, HfN, HfSiN, Ti, TiN, TiSiN, Mo, MoN, Re, Pt, Ru, doped hafnium zirconium nitride, and doped hafnium zirconium oxynitride.

15. The device of claim 14, wherein the doped hafnium zirconium nitride has the formula $Hf_xZr_yD'_kN_n$ and the doped hafnium zirconium oxynitride has the formula $Hf_xZr_yD'_kO_mN_n$ wherein x, y, k, m, and n are non-zero numbers.

16. A semiconductor device comprising:
a substrate;
a gate dielectric over the substrate, wherein the gate dielectric comprises a doped hafnium zirconium nitride film of the following formula:

$$Hf_xZr_yD'_kN_n$$

wherein D' includes one or more dopant elements selected from Be, Mg, Ca, Sr, Ba, Ra, B, Ga, In, Tl, Y, Lu, La, Ce, Pr, Nd, Sm, Eu, Gd, Tb, Dy, Ho, Er, Tm, and Yb, and wherein x, y, k, and n are non-zero numbers; and
a conductive gate electrode film over the gate dielectric, wherein the doped hafnium zirconium nitride film forms a stable cubic or tetragonal form that survives annealing to the substrate.

17. A semiconductor device comprising:
a substrate;
a gate dielectric over the substrate, wherein the gate dielectric comprises a doped hafnium zirconium oxynitride film of the following formula:

$$Hf_xZr_yD'_kO_mN_n$$

wherein D' includes one or more dopant elements selected from Be, Mg, Ca, Sr, Ba, Ra, B, Ga, In, Tl, Y, Lu, La, Ce, Pr, Nd, Sm, Eu, Gd, Tb, Dy, Ho, Er, Tm, and Yb, and wherein x, y, k, m, and n are non-zero numbers; and
a conductive gate electrode film over the gate dielectric, wherein the doped hafnium zirconium oxynitride film forms a stable cubic or tetragonal form that survives annealing to the substrate.

* * * * *